USOO5650040A

United States Patent [19]

New

[11] Patent Number: 5,650,040
[45] Date of Patent: Jul. 22, 1997

[54] INTERFACIAL ETCH OF SILICA TO IMPROVE ADHERENCE OF NOBLE METALS

[75] Inventor: Daryl Christopher New, Meridian, Id.

[73] Assignee: Micron Technology, Inc., Boise, Id.

[21] Appl. No.: 565,120

[22] Filed: Nov. 30, 1995

[51] Int. Cl.⁶ .................................................. H01L 21/3105
[52] U.S. Cl. ...................... 156/643.1; 156/657.1; 156/662.1; 204/192.37; 437/228
[58] Field of Search ........................ 156/643.1, 646.1, 156/657.1, 662.1; 216/34, 35; 204/192.37; 437/228, 946

[56] References Cited

U.S. PATENT DOCUMENTS

| | | | |
|---|---|---|---|
| 4,129,848 | 12/1978 | Frank et al. | 204/192.23 |
| 4,377,438 | 3/1983 | Moriya et al. | 156/657.1 |
| 4,507,851 | 4/1985 | Joyner et al. | 156/653.1 |
| 4,585,517 | 4/1986 | Stemple | 156/657.1 |
| 4,715,941 | 12/1987 | Jones et al. | 216/34 |
| 4,946,546 | 8/1990 | Bourgeois-Maine | 216/35 |
| 5,021,121 | 6/1991 | Groechel et al. | 156/657.1 |
| 5,139,974 | 8/1992 | Sandhu et al. | 437/946 |
| 5,294,294 | 3/1994 | Namose | 156/657.1 |
| 5,344,793 | 9/1994 | Zeininger et al. | 437/946 |

FOREIGN PATENT DOCUMENTS 53-039864  4/1978  Japan .

OTHER PUBLICATIONS

Cote, W.J. et al. "Enhanced Adhesion to Interlevel Polymide" IBM Tech. Discl. Bull. vol. 26, No. 7A, p. 3104 Dec. 1983.

Primary Examiner—R. Bruce Breneman
Assistant Examiner—Anita Alanko
Attorney, Agent, or Firm—Workman, Nydegger & Seeley

[57] ABSTRACT

An improved interface between a TEOS or silane nitrous oxide dielectric layer and a noble metal film such as a platinum film is provided by etching an upper surface of the dielectric layer prior to depositing the metal film thereon. The interface exhibits increased adhesion compared to similar interfaces formed without an etch of an upper surface of a dielectric layer prior to metal film deposition.

21 Claims, 1 Drawing Sheet

INTERFACIAL ETCH OF SILICA TO IMPROVE ADHERENCE OF NOBLE METALS

BACKGROUND OF THE INVENTION

1. The Field of the Invention

The present invention relates to the manufacture of semiconductor devices. More particularly, the present invention is directed to methods and structures for improved interfacial adhesion between TEOS films or silane nitrous oxide films and a noble metal such as platinum for use in semiconductor devices.

2. The Relevant Technology

Platinum and other noble metals may be used within semiconductor device structures for various purposes, including for example for capacitor electrodes and general metalization. Because noble metals typically do not bond chemically to other materials used within semiconductor device structures, steps such as alloying must be taken to assure good adhesion of a deposited metal film. In some circumstances, alloying is either undesirable or not possible. For example, alloying is undesirable or even impossible when the noble metal to be deposited has a high melting point, as does platinum, or when the underlying layer is incompatible with the noble metal.

Methods other than alloying for promoting adhesion of noble metal films are thus needed.

SUMMARY AND OBJECTS OF THE INVENTION

An object of the present invention is to provide a method of increasing the adhesion of a noble metal film to a dielectric layer comprising at least one of TEOS and silane nitrous oxide.

Another object of the present invention is to provide a method of increasing the adhesion of a platinum film to a dielectric layer comprising a least one of TEOS and silane nitrous oxide.

Yet another object of the present invention is to provide an improved interface between a layer of a noble metal and a dielectric layer comprising at least one of TEOS and silane nitrous oxide, the interface providing improved adhesion between the layer of noble metal and the dielectric layer.

Still another object of the present invention is to provide an improved interface between a layer of platinum and a dielectric layer comprising at least one of TEOS and silane nitrous oxide, the interface providing improved adhesion between the layer of noble metal and the dielectric layer.

In accordance with the present invention, an interface between a TEOS or silane nitrous oxide dielectric layer and a noble metal film such as a platinum film is provided by etching an upper surface of the dielectric layer prior to depositing the metal film thereon. The interface exhibits increased adhesion compared to similar interfaces formed without an etch of an upper surface of a dielectric layer prior to metal film deposition. The increased adhesion of the interface produced by the method of the present invention enables effective uses of noble metals within the structure of semiconductor devices, such uses including, for example the formation of capacitor plates and uses for general metalization.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention introduces for use in semiconductor devices both an improved interface providing increased adhesion between a dielectric material and a noble metal, and method to produce such an improved interface. The precise physical or chemical mechanisms for the increased adhesion have not as yet been determined, thus the improved interface is characterized herein by the method of its formation.

Figure 1:
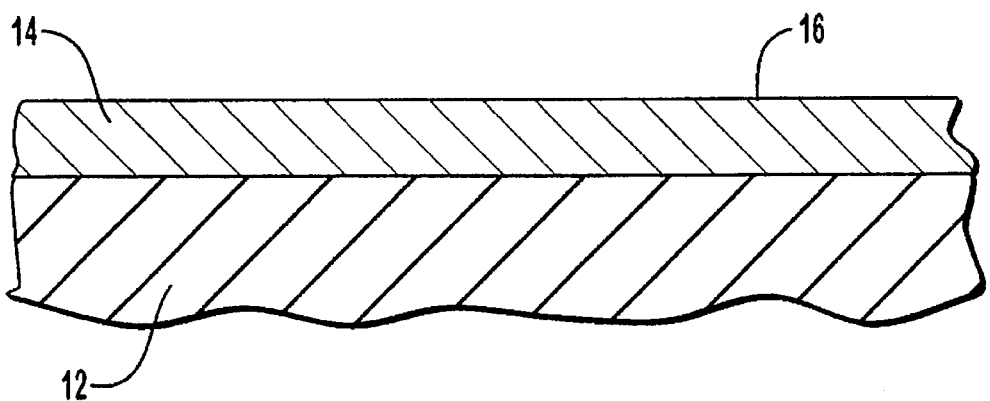
FIG. 1 is a partial cross section of a partially formed semiconductor device including a dielectric layer.

According to a presently preferred method of the present invention, a dielectric layer comprising either TEOS or silane nitrous oxide is first provided, such as dielectric layer 14 shown in FIG. 1. The dielectric layer will typically be formed on and supported by an underlying layer 12, which may be a semiconductor substrate such as silicon, or may be an intermediate layer formed in the fabrication process. Dielectric layer 14 may be produced on underlying layer 12 by any conventional means, such as CVD, PECVD, and others. Dielectric layer 14 has an upper surface 16.

Next, dielectric layer 14 is etched at upper surface 16 thereof. Various types of etch processes may be employed, including reactive ion etch (RIE), magnetically enhanced reactive ion etch (MERIE), high density etch, physical sputtering, ion beam milling and the like. MERIE is currently preferred.

For an MERIE etch, any atmosphere containing sufficient available carbon and fluorine will chemically etch dielectric layer 14. $C_2F_6$ or a mixture of $CF_4$ and $CHF_3$ may be employed, with the flow rate ratio of $CF_4$ to $CHF_3$ preferably within the range of about 1:1 to about 4:1, and most preferably at about 1:1. The etch is performed for a preselected time. As an example, such an MERIE etch has been performed successfully in an Applied Materials etcher at a pressure of 200 mTorr, a power level of 600 W, and a magnetic field of 100 Gauss with 35 sccm flows of both $CF_4$ and $CHF_3$ for 27 seconds. This etcher is model AME 5000, manufactured by Applied Materials, Inc. which is located in Santa Clara, Calif., U.S.A.

Figure 2:
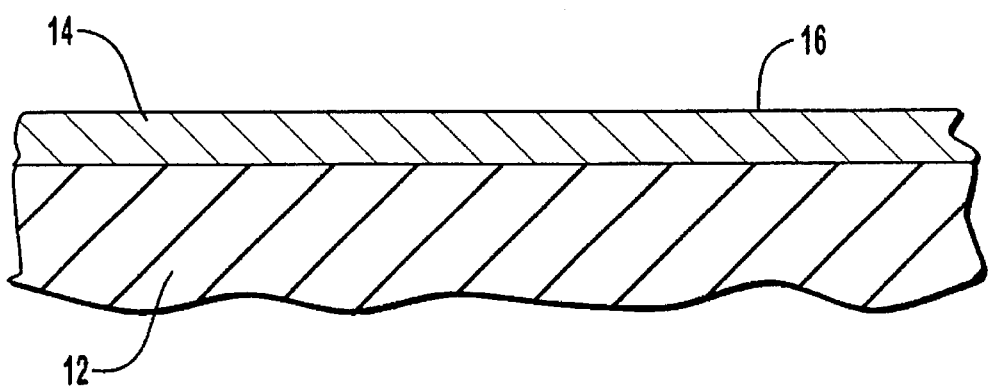
FIG. 2 is a partial cross section of the partially formed semiconductor device of FIG. 1 after an etch step.

In the MERIE etch, a portion of dielectric layer 14 at upper surface 16 thereof is removed by the etch, resulting in decreased thickness of dielectric layer 14, as shown in FIG. 2. The initial thickness of the dielectric layer must thus be sufficient to adequately minimize the risk of etching therethrough, preferably at least 100 Angstroms or greater.

Figure 3:
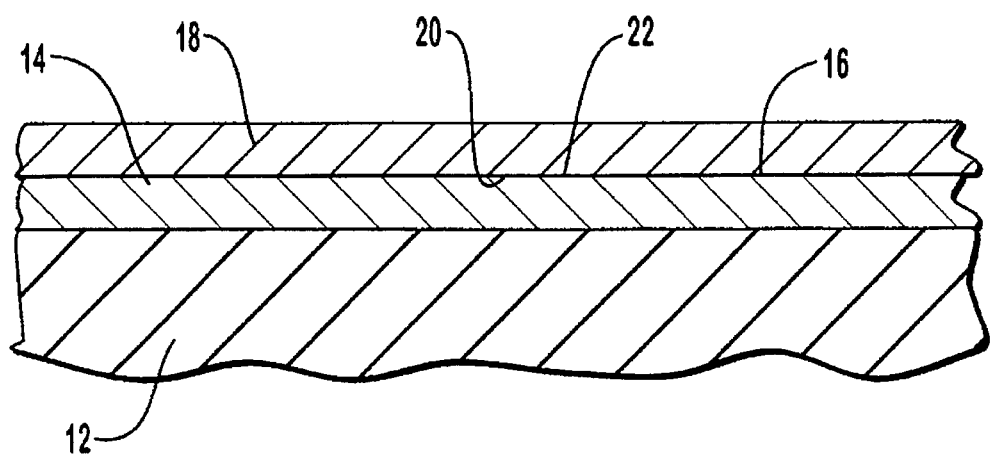
FIG. 3 is a partial cross section of the partially formed semiconductor device of FIG. 2 after a deposition step.

A noble metal film 18 is then deposited on top surface 16 of dielectric layer 14 as shown in FIG. 3, resulting in an interface 22 at top surface 16 of dielectric layer 14 and a lower surface 20 of noble metal film 18. Noble metal films and noble-metal containing alloy films can benefit from the inventive process, with platinum currently most preferred. The metal film may be deposited by conventional means, including evaporation and sputtering. The metal film may be patterned as desired during further processing.

Interface 22 produced by the above method between dielectric layer 14 and noble metal film 18 exhibits increased adhesion compared with interfaces created without an etch of the underlying dielectric layer. The increased adhesion provides the possibility of greater use of noble metals for various structures in semiconductor devices, including for example for capacitor plates and general metalization. The above method may be beneficially employed in many technologies, including FERAM, DRAM, SRAM, VRAM and nonsilicon based technologies such as BST.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for providing in a semiconductor device an improved interface between a noble metal film and dielectric layer, said method comprising the steps of:
   (a) providing the dielectric layer on an traderlying substrate, the dielectric layer having an upper surface and comprising silica;
   (b) reactive ion etching the upper surface of said dielectric layer; and
   (c) depositing the noble metal film upon the upper surface of said dielectric layer,
whereby an interface is formed between said dielectric layer and said noble metal film with said interface having good adhesion.

2. The method as defined in claim 1, wherein said step of etching the upper surface comprises a magnetically enhanced reactive ion etch step.

3. The method as defined in claim 1, wherein said step of etching the upper surface comprises a high density etch step.

4. The method as defined in claim 1, wherein said step of etching the upper surface comprises the step of etching in an atmosphere containing carbon and fluorine.

5. The method as defined in claim 4, wherein said step of etching the upper surface comprises the step of etching in an atmosphere containing $CF_4$ and $CHF_3$.

6. The method as defined in claim 5, wherein the flow rate ratio of $CF_4$ to $CHF_3$ in said atmosphere is within the range of 1:1 to 4:1.

7. The method as defined in claim 6, wherein the ratio of $CF_4$ to $CHF_3$ in said atmosphere is about 1:1.

8. The method as defined in claim 4, wherein said step of etching the upper surface comprises the step of etching in an atmosphere containing $C_2F_6$.

9. The method as defined in claim 1, wherein said dielectric layer consists of a TEOS dielectric.

10. The method as defined in claim 1, wherein said dielectric layer consists of a silane nitrous oxide dielectric.

11. The method as defined in claim 1, wherein said dielectric layer has a thickness of at least about 100 Angstroms.

12. The method as defined in claim 1, wherein said step of etching the upper surface comprises the step of etching said dielectric layer for a selected time.

13. The method as defined in claim 1, wherein said step of depositing the noble metal film comprises the step of depositing the noble metal film by evaporation.

14. The method as defined in claim 1, wherein said step of depositing the noble metal film comprises the step of depositing the noble metal film by sputtering.

15. The method as defined in claim 1, wherein said underlying substrate is a semiconductor substrate.

16. A method for providing in a semiconductor device an improved interface between a platinum film and a dielectric layer, said method comprising the steps of:
   (a) providing the dielectric layer on an underlying substrate, the dielectric layer having an upper surface and comprising silica;
   (b) reactive ion etching the upper surface of said dielectric layer in an atmosphere containing carbon and fluorine; and
   (c) depositing the platinum film upon the upper surface of said dielectric layer,
whereby an interface is formed between said dielectric layer and said noble metal film, said interface having good adhesion.

17. The method as defined in claim 16, wherein said step of etching the upper surface comprises the step of etching in an atmosphere containing $CF_4$ and $CHF_3$.

18. The method as defined in claim 17, wherein the flow rate ratio of $CF_4$ to $CHF_3$ in said atmosphere is within the range of 1:1 to 4:1.

19. The method as defined in claim 18, wherein the flow rate ratio of $CF_4$ to $CHF_3$ in said atmosphere is about 1:1.

20. The method as defined in claim 16, wherein said step of etching the upper surface comprises the step of etching in an atmosphere containing $C_2F_6$.

21. The method as defined in claim 16, wherein said underlying substrate is a semiconductor substrate.

* * * * *